(12) United States Patent
Nichols et al.

(10) Patent No.: US 9,713,266 B2
(45) Date of Patent: Jul. 18, 2017

(54) METHOD FOR MANUFACTURE OF FINE LINE CIRCUITRY

(71) Applicant: Atotech Deutschland GmbH, Berlin (DE)

(72) Inventors: Richard Nichols, Berlin (DE); Don Jang, Berlin (DE); Harald Riebel, Berlin (DE); Frank Brüning, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 135 days.

(21) Appl. No.: 14/373,961

(22) PCT Filed: Feb. 6, 2013

(86) PCT No.: PCT/EP2013/052318
§ 371 (c)(1),
(2) Date: Jul. 23, 2014

(87) PCT Pub. No.: WO2013/143732
PCT Pub. Date: Oct. 3, 2013

(65) Prior Publication Data
US 2015/0083602 A1    Mar. 26, 2015

(30) Foreign Application Priority Data

Mar. 29, 2012  (EP) .................................... 12075035

(51) Int. Cl.
*C25D 5/56* (2006.01)
*C25D 7/00* (2006.01)
(Continued)

(52) U.S. Cl.
CPC ......... *H05K 3/387* (2013.01); *C23C 18/1653* (2013.01); *C23C 18/2006* (2013.01);
(Continued)

(58) Field of Classification Search
CPC .................................. C25D 7/06; H05K 3/38
See application file for complete search history.

(56) References Cited

U.S. PATENT DOCUMENTS

| 5,106,473 A |   | 4/1992 | Whitlaw et al. |
|---|---|---|---|
| 5,554,672 A | * | 9/1996 | Saito ..................... C04B 41/009 523/466 |

(Continued)

FOREIGN PATENT DOCUMENTS

| CN | 1612951 A | 5/2005 |
|---|---|---|
| CN | 1101133187 A | 2/2008 |

(Continued)

OTHER PUBLICATIONS

PCT/EP2013/052318; PCT International Search Report and Written Opinion of the International Searching Authority dated Mar. 6, 2013.

(Continued)

*Primary Examiner* — Stefanie S Wittenberg
(74) *Attorney, Agent, or Firm* — Renner, Otto, Boisselle & Sklar, LLP (57) ABSTRACT

The present invention relates to a method for manufacture of fine line circuitry in the manufacture of printed circuit boards, IC substrates and the like. The method utilizes a first conductive layer on the smooth surface of a build-up layer and a second conductive layer selected from electrically conductive polymers, colloidal noble metals and electrically conductive carbon particles on the roughened walls of at least one opening which are formed after depositing the first conductive layer.

20 Claims, 4 Drawing Sheets

(51) Int. Cl.
  *H05K 3/38* (2006.01)
  *H05K 3/42* (2006.01)
  *C25D 5/02* (2006.01)
  *H05K 3/46* (2006.01)
  *C23C 18/40* (2006.01)
  *C25D 7/06* (2006.01)
  *H05K 3/06* (2006.01)
  *C23C 18/16* (2006.01)
  *C23C 18/20* (2006.01)
  *H05K 3/10* (2006.01)
  *C25D 3/38* (2006.01)
  *C23C 18/30* (2006.01)

(52) U.S. Cl.
  CPC .............. *C23C 18/40* (2013.01); *C25D 5/022* (2013.01); *C25D 5/56* (2013.01); *C25D 7/00* (2013.01); *C25D 7/06* (2013.01); *H05K 3/06* (2013.01); *H05K 3/381* (2013.01); *H05K 3/389* (2013.01); *H05K 3/421* (2013.01); *H05K 3/4644* (2013.01); *C23C 18/2066* (2013.01); *C23C 18/30* (2013.01); *C23C 18/405* (2013.01); *C25D 3/38* (2013.01); *H05K 3/108* (2013.01); *H05K 3/388* (2013.01); *H05K 2203/0789* (2013.01); *H05K 2203/0793* (2013.01); *H05K 2203/0796* (2013.01)

(56) References Cited

U.S. PATENT DOCUMENTS

| | | | | |
|---|---|---|---|---|
| 5,571,365 | A | * | 11/1996 | Maehata ................ C09J 163/00 156/326 |
| 5,575,898 | A | * | 11/1996 | Wolf et al. .................... 205/125 |
| 2003/0000830 | A1 | * | 1/2003 | Spain ....................... C25D 5/02 204/194 |
| 2003/0145458 | A1 | | 8/2003 | Tani et al. |
| 2004/0112755 | A1 | | 6/2004 | Czeczka et al. |
| 2005/0218487 | A1 | | 10/2005 | Kimura et al. |
| 2007/0158203 | A1 | | 7/2007 | Chang et al. |
| 2008/0138629 | A1 | | 6/2008 | Kawamura et al. |
| 2010/0178512 | A1 | | 7/2010 | Giesenberg et al. |
| 2011/0247865 | A1 | | 10/2011 | Tsurumi |

FOREIGN PATENT DOCUMENTS

| | | | |
|---|---|---|---|
| EP | 1978024 | 10/2008 | |
| JP | 10-022641 | * 1/1998 | .............. H05K 3/46 |
| TW | 201210426 | 3/2012 | |

OTHER PUBLICATIONS

Search Report for corresponding Taiwanese Application No. 102107120 dated Jul. 18, 2016.

Official Action for corresponding Chinese Application No. 201380010024.9 dated Aug. 1, 2016.

* cited by examiner

METHOD FOR MANUFACTURE OF FINE LINE CIRCUITRY

The present application is a U.S. National Stage Application based on and claiming benefit and priority under 35 U.S.C. §371 of International Application No. PCT/EP2013/052318, filed 06 Feb. 2013, which in turn claims benefit of and priority to European Application No. 12075035.1, filed 29 Mar. 2012, the entirety of each of which is hereby incorporated herein by reference.

FIELD OF THE INVENTION

The present invention relates to a method for manufacture of printed circuit boards, IC substrates and the like. More particularly, the invention relates to a method for manufacture of fine line circuitry.

BACKGROUND OF THE INVENTION

The ongoing miniaturization of features of HDI printed circuit boards, IC substrates and the like requires more advanced manufacturing methods than conventional methods such as formation of circuitry by a print and etch method.

Figure 1:
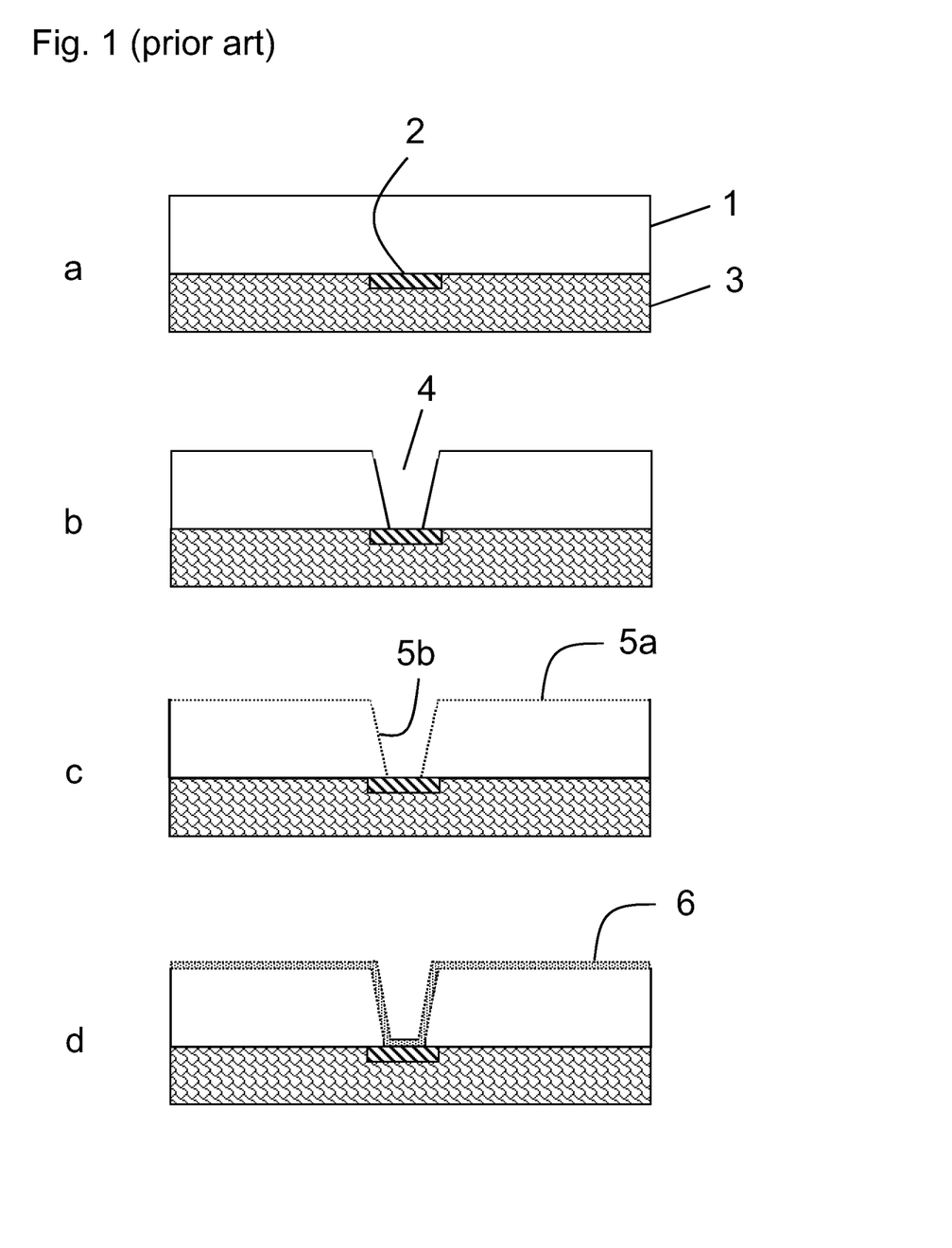
FIG. 1 shows a semi-additive process (SAP) according to a prior art method.

A method for manufacture of fine line circuitry known in the art is the semi-additive process (SAP) which starts from a bare dielectric build-up layer (1) having on at least a portion of the back side a copper area which can be for example a contact area (2), and a second dielectric layer (3) attached to the back side of the dielectric build-up layer (1). Such a substrate is shown in FIG. 1a. At least one opening (4) such as a blind micro via is formed by e.g. laser drilling in the build-up layer (1) which extends through the substrate to the copper area (2) on the back side of the build-up layer (1) (FIG. 1b). The dielectric surface of the build-up layer (1) is subjected to a desmear process in the next step which leads to a roughened top surface (5a) of the build-up layer (1) and a roughened surface (5b) of the dielectric side walls of the at least one opening (4) (FIG. 1c).

Further activation of the roughened top surface (5a) and the roughened side walls (5b) by e.g. depositing a noble metal containing activator is necessary for successive electroless plating of copper. Next, a conductive seed layer (6), generally made of copper, is deposited by electroless plating onto the roughened top surface (5a) of the build-up layer (1) and the roughened side walls (5b) of the at least one opening (4) (FIG. 1d). Such a conductive layer (6) usually has a thickness of 0.8 µm to 1.5 µm which is a) required to provide a sufficient electrical conductivity on the roughened top surface (5a) for successive electroplating of copper and b) to ensure that during electroless plating of copper also a sufficient electrical conductivity is provided to the roughened side walls (5b) of the at least one opening (4).

A thicker layer of copper (8) is then selectively electroplated into openings of a patterned resist layer (7) onto the roughened and activated top surface of the build-up layer (1) and the roughened and activated dielectric walls of the at least one opening (4) (FIG. 1e to f). The patterned resist layer (7) is removed (FIG. 1g) and those portions of the conductive layer (6) which are not covered by electroplated copper (8) are removed by differential etching (FIG. 1h). Such a process is for example disclosed in U.S. Pat. Nos. 6,278,185 B1 and 6,212,769 B1.

One disadvantage of the SAP method is the weak adhesion between the conductive layer (6) and the dielectric surface of the build-up layer (1). The weak adhesion can lead to an undesired delamination of the copper tracks formed by subsequent electroplating of copper onto the conductive layer (6) in later manufacturing steps or later use of the printed circuit board.

Furthermore, the desmear process applied to the top surface of the build-up layer (1) causes a roughening of the dielectric surface. On the one hand, roughening of the dielectric surface is necessary to provide adhesion between the dielectric surface and the conductive layer (6), on the other hand a roughened top surface (5a) of the build-up layer (1) does not allow formation of a fine line circuitry such as one having a line width and inter line spacing of 10 µm or less.

A roughened top surface of the build-up layer (1) requires severe etching conditions in order to remove those portions of the conductive layer (6) from those areas which are not covered by electroplated copper (8). Severe etch conditions lead to an undesired attack of the copper layer (8) and the desired shape of electroplated copper features can not be achieved.

A method for improving the adhesion of a first metal layer on a smooth dielectric surface is disclosed in U.S. 2011/0247865 A1. A polymer adhesive layer which can interact with a plating catalyst or precursor thereof is deposited onto a smooth dielectric layer and thereby the adhesion between the dielectric layer and a first metal layer deposited thereon is increased. Said polymeric adhesion layer is attacked when smear and other undesired residues formed during via formation is removed from the contact pad and the side walls of the via. This cleaning step is mandatory for metallization of the via in later process steps. Accordingly, undesired wedges at the interface polymer adhesion layer/first metal layer/side wall(s) of the via(s) are formed and thereby the adhesion of the first metal layer on the smooth dielectric surface is reduced.

OBJECTIVE OF THE INVENTION

Therefore, it is the objective of the present invention to provide a method for manufacture of fine line circuitry which avoids or minimizes the disadvantages derived from the roughening of the top surface of the build-up layer (1) prior to deposition of a conductive layer onto said roughened top surface while providing a sufficient adhesion between the conductive layer (6) and the top surface of the build-up layer (1).

SUMMARY OF THE INVENTION

This objective is solved by a method for manufacture of fine line circuitry comprising, in this order, the steps of (i) providing a dielectric build-up layer (1) having a front side (1a) and a back side (1b) surface area and wherein at least a portion of the back side surface area (1b) comprises a copper area (2) and wherein a dielectric layer (3) is attached to said back side surface area, (1 b) and wherein an adhesion promoting layer (9) selected from the group consisting of organosilane compounds, substituted porphyrins, copper precursor compounds, and nanometer-sized oxide particles having at least one attachment group bearing a functional chemical group suitable for binding to the substrate is attached to the front side (1a) surface area of the build-up layer (1), (ii) depositing a first conductive layer (10) onto the adhesion promoting layer (9), (iii) forming at least one opening (4) which extends through the first conductive layer (10), the adhesion promoting layer (9) and the build-up layer (1) to the at least one copper area (2), (iv) cleaning the dielectric side walls and the copper area (2) of the at least one opening (4) to obtain cleaned side walls (5b) and a cleaned copper area (2), (v) forming a second conductive layer (11) on at least the cleaned side walls (5b) wherein the second conductive layer (11) is selected from the group consisting of electrically conductive polymers, colloidal particles comprising a noble metal, electrically conductive carbon particles and copper deposited by electroless plating, (vi) applying a resist layer (7) onto the first conductive layer (10) or onto the second conductive layer (11) in case the second conductive layer (11) is copper deposited by electroless plating; and patterning said resist layer (7), (vii) depositing a copper layer (8) by electroplating into the openings of the patterned resist layer (7), (viii) removing the patterned resist layer (7) and (ix) removing those portions of the first conductive layer (10) or the second conductive layer (11) in case the second conductive layer (11) is copper deposited by electroless plating which are not covered by the electroplated copper layer (8).

The first conductive layer (10) shows a sufficient adhesion to the front side (1a) surface area of the build-up layer (1). Furthermore, because no desmear process is applied to the front side (1a) surface area of the build-up layer (1) prior to deposition of the first conductive layer (10) and because the first conductive layer (10) also serves as a protection layer when cleaning the side walls and the copper area (2) of the at least one opening (4), a smooth front side (1a) surface area of the build-up layer (1) is maintained and hence, formation of fine line circuitry such as one having a line width and inter line spacing of 10 μm or less is possible. The smooth front side (1a) surface area of the build-up layer (1) also enables to use mild etching conditions in order to completely remove in step (ix) those portions of the first conductive layer (10) which were covered by the patterned resist layer (7) in steps (vi) and (vii).

Accordingly, the desired shape of electroplated copper features can be achieved and a high adhesion between the first conductive layer (10) and the front side (1a) surface area of the build-up layer (1) is maintained after cleaning the side walls and the copper area (2) of the at least one opening (4).

DETAILED DESCRIPTION OF THE INVENTION

The method for manufacture of fine line circuitry is in more detail described below. The figures shown herein are simply illustrative of the process. The figures are not drawn to scale, i.e. they do not reflect the actual dimensions or features of the various layers in the laminate. Like numbers refer to like elements throughout the description.

Figure 2:
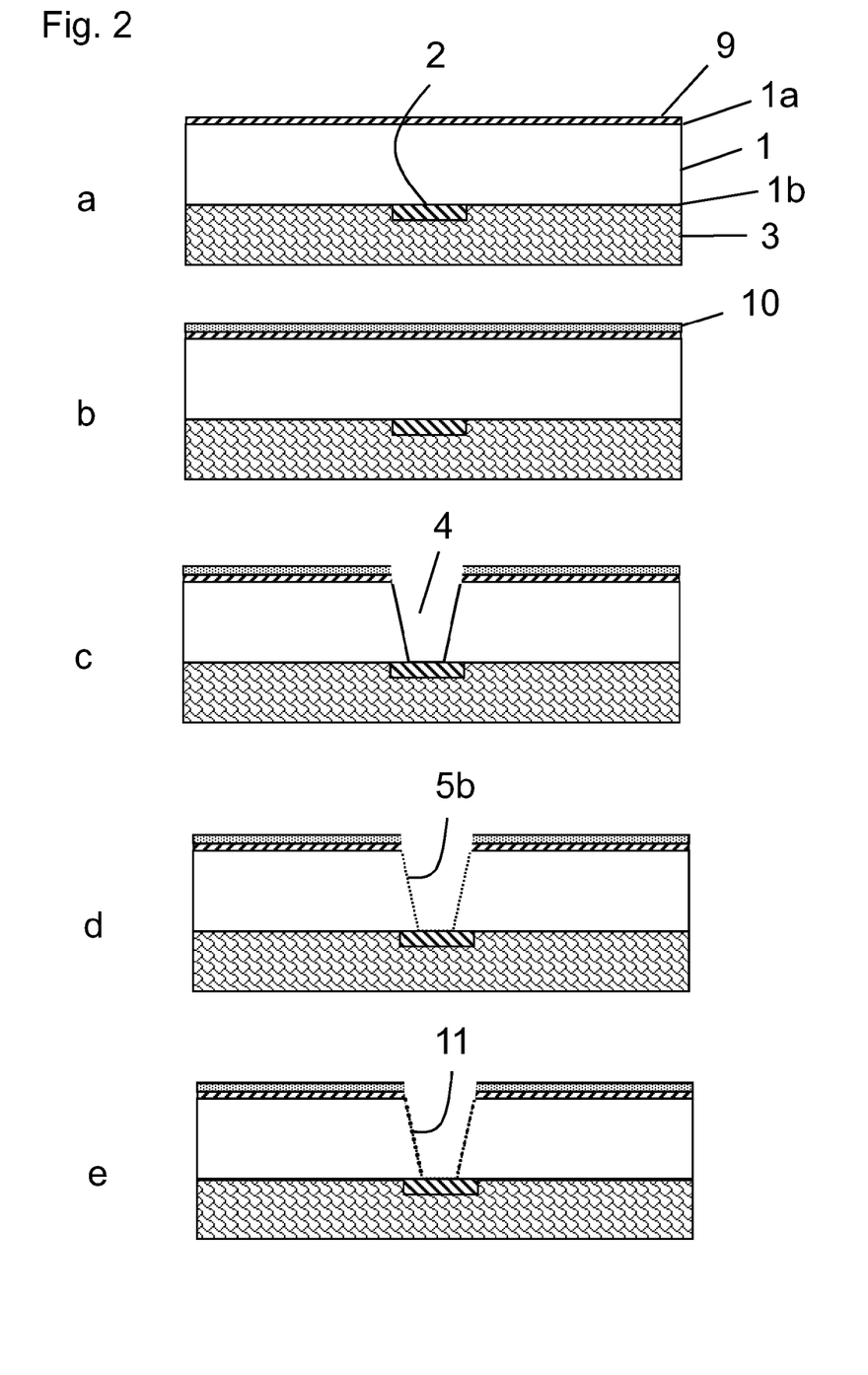
FIG. 2 shows the method for manufacture of fine line circuitry according to the present invention.

Now referring to FIG. 2a, in accordance with a preferred embodiment of the present invention, there is provided a dielectric build-up layer (1) which may be made of an organic material or a fiber-reinforced organic material or a particle-reinforced organic material, etc., for example, epoxy resin, polyimide, bismaleimide triazine, cyanate ester, polybenzocyclobutene, or glass fiber composite thereof, etc. The build-up layer (1) comprises a front side (1a) and a back side (1b). The front side (1a) of the build-up layer (1) consists of bare dielectric material having a smooth surface which comprises an adhesion promoting layer (9). Attached to at least a portion of the back side (1b) of the build-up layer (1) is a copper area (2) which can for example be a contact pad, a copper filled through-hole or a copper filled blind micro via. Also attached to the back side (1b) of the build-up layer (1) is a second dielectric layer (3). Such a laminate is shown in FIG. 2a.

The adhesion promoting layer (9) attached to the front side (1a) of the build-up layer (1) can be a very thin layer, e.g. a monolayer, a layer consisting of several monolayers or islands of an adhesion promoting substance distributed on the smooth surface of the build-up layer (1) front side (1a). The adhesion promoting layer (9) is required to achieve a sufficient adhesion between the smooth front side (1a) of the build-up layer (1) and the first conductive layer (10).

Preferably, the front side (1a) surface area of the build-up layer (1) is not subjected to a desmear method in order to retain a smooth surface of said front side (1a) surface area of the build-up layer (1). Instead, the top surface of the build-up layer (1) is cleaned by standard methods.

Next, the adhesion promoting layer (9) is deposited onto the top surface of the build-up layer (1). Suitable methods for deposition are for example dip coating, spin coating, ink jet printing, spray coating and vapour phase deposition such as for example chemical vapour deposition (CVD) and physical vapour deposition (PVD).

The adhesion promoting layer (9) is preferably selected from:

a layer obtained by deposition of at least one organosilane compound and successive treatment with an oxidizing agent;

organic molecules being configured to bind metal ions, for example such disclosed in WO 2009/029863 A1. The organic molecules preferably contain a surface active moiety selected from a macrocyclic proligand, a macrocyclic complex, a sandwich coordination complex and polymers thereof. Most preferably, the surface active moiety for this type of adhesion promoting layer (9) is a substituted porphyrin;

a layer of a copper precursor compound such as a N-heterocyclic carbene copper(I) compound as disclosed in US 2009/0004385 A1;

nanometer-sized oxide particles selected from one or more of silica, alumina, titania, zirconia, tin oxide and zinc oxide particles having at least one attachment group bearing a functional chemical group suitable for binding to the substrate. Suitable functional groups are for example amino, carbonyl, carboxyl, ester, epoxy, mercapto, hydroxyl, acrylic, methacrylic, anhydride, acid halide, halogen, allyl, vinyl, styrene, aryl, acetylene, azide group; 5 to 6 membered heterocyclic hydrocarbon groups containing from 1 to 3 nitrogen atoms; isonicotinamidyl, bipyridyl, nitrile, isonitrile and thiocyanate. Such adhesion promoting layers (9) are disclosed in EP 11191974.2.

A particular suitable adhesion promoting layer (9) can be formed by a method comprising in this order the steps of (a) treating the front side (1a) of the build-up layer (1) with a solution comprising at least one organosilane compound and optionally (b) treating said front side (1a) with a solution comprising an oxidizing agent.

The organosilane compound is preferably selected from the group represented by the formula $$A_{(4-x)}SiB_x$$

wherein
each A is independently a hydrolyzable group,
x is 1 to 3, and
each B is independently selected from the group consisting of $C_1$-$C_{20}$ alkyl, aryl, amino aryl, and a functional group represented by the formula $$C_nH_{2n}X,$$

wherein
n is preferably from 0 to 20, more preferably from 0 to 8 and
X is preferably selected from the group consisting of amino, amido, hydroxy, alkoxy, halo, mercapto, carboxy, carboxy ester, carboxamide, thiocarboxamide, acyl, vinyl, allyl, styryl, epoxy, epoxycyclohexyl, glycidoxy, isocyanato, thiocyanato, thioisocyanato, ureido, thioureido, guanidino, thioglycidoxy, acryloxy, methacryloxy groups, carboxy ester, and $Si(OR)_3$, wherein R is a $C_1$-$C_5$ alkyl group.

More preferably, the hydrolyzable group A is selected from —OH, —$OR^2$ and wherein $R^2$ is selected from the group consisting of $C_1$-$C_5$ alkyl and —$OCOR^3$ and wherein $R^3$ is H or a $C_1$-$C_5$ alkyl group.

Examples of particular classes of compounds within the formulas above are vinylsilanes, aminoalkylsilanes, ureidoalkylsilane esters, epoxyalkylsilanes and methacryloalkylsilane esters, in which the reactive organic functions are, respectively, vinyl, amino, ureido, epoxy and methacryloxy. Examples of the vinyl-silanes are vinyltrichlorosilane, vinyltriethoxysilane, vinyltrimethoxysilane, vinyl-tris-(beta(2)-methoxyethoxy) silane and vinyltriacetoxysilane. As examples of the aminoalkylsilanes, which are the preferred organosilanes for use in the present invention, are gamma (3)-aminopropyltriethoxysilane, gamma-aminopropyltrimethoxysilane, N-beta-(Aminoethyl)-gamma-aminopropyltri-methoxysilane, and $N^1$-(beta-aminoethyl)-N-(beta-aminoethyl)-gamma-amino-propyltrimethoxysilane. A suitable ureidoalkylsilane ester is gammaureidoalkyl-triethoxysilane, while suitable epoxyalkylsilanes are beta-(3, 4-epoxycyclohexyl)-ethyltrimethoxysilane and gam maglycidoxypropyltri methoxysilane. Useful methacryloxysilane esters are gamma-methacryloxypropyltrimethoxy silane and gamma-methacryloxypropyl-tris-(beta-methoxyethoxy) silane.

The at least one organosilane compound can either be a monomeric organosilane compound or an oligomeric organosilane compound which is obtained by a (partial) hydrolyzation and condensation of a monomeric organosilane compound according to the present invention prior to the deposition onto the surface of the dielectric substrate.

The hydrolysis and condensation of organosilane compounds is well known in the art. For example, the monomeric organosilane compound is reacted with an acidic catalyst, for example, acetic acid or diluted hydrochloric acid leading to a clear solution of an oligomeric organosilane compound derived from the monomeric organosilane compound.

Such oligomeric silanes derived from monomeric organosilane compound according to the present by hydrolization shall be included into the scope of the present invention.

The front side (1a) of the build-up layer (1) is contacted with the solution comprising at least one organosilane compound for a period of time of between 10 s and 10 min at a temperature of between 15 and 50° C.

Next, the front side (1a) of the build-up layer (1) is optionally contacted with a solution comprising an oxidizing agent.

The oxidizing agent can be an aqueous acidic or alkaline solution of permanganate, hydrogen peroxide and sulphuric acid or chromic acid.

Alkaline solutions of permanganate, e.g. sodium or potassium permanganate are preferred. The solution preferably contains 20-100 g/l permanganate ions and 10-40 g/l hydroxide ions. A preferred hydroxide ion source is sodium or potassium hydroxide.

The front side (1a) of the build-up layer (1) is contacted with the solution comprising an oxidizing agent for a period of time of between 1 and 30 min at a temperature of between 20 and 95° C. to obtain a roughened surface having an average surface roughness $R_a$ of less than 150 nm.

A curing step is optionally applied after deposition of the adhesion promoting layer (9). The maximum curing temperature is in the range of 25 to 250° C., more preferably in the range of 100 to 200° C.

The top surface of the build-up layer (1) may then be rinsed, preferably with water.

The adhesion promoting layer (9) attached to the front side (1a) of the build-up layer (1) serves to stabilize formation of the first conductive layer, e.g. to stabilize bonding of copper ions from the electroless plating bath utilized in step (ii) to the front side (1a) surface of the build-up layer (1) and facilitate deposition of metallic copper.

Next, a first conductive layer (10) is deposited onto the adhesion promoting layer (9) in step (ii). This is shown in FIG. 2b. The first conductive layer (10) serves together with the second conductive layer (11) as an electrically conductive base for the electroplating of copper (8) in step (vii).

Preferably, the first conductive layer (10) comprises copper and is deposited by electroless plating. Preferably in this case, the substrate is activated by e.g., deposition of a noble metal containing colloid, a solution comprising noble metal ions or a solution comprising a palladium complex prior to electroless deposition of copper. The most preferable activation is by deposition of palladium-tin colloids, palladium ions and palladium complexes. Such methods are established in the arts and known to the skilled person.

Suitable electroless plating electrolytes for deposition of copper comprise for example a source of copper ions, pH modifiers, complexing agents such as EDTA, alkanol amines or tartrate salts, accelerators, stabilizer additives and a reducing agent. In most cases formaldehyde is used as reducing agent, other common reducing agents are hypophosphite, dimethylamine borane and boro-hydride. Typical stabilizer additives for electroless copper plating electrolytes are compounds such as mercaptobenzothiazole, thiourea, various other sulphur compounds, cyanide and/or ferrocyanide and/or cobaltocyanide salts, poly-ethyleneglycol derivatives, heterocyclic nitrogen compounds, methyl butynol, and propionitrile. In addition, molecular oxygen is often used as a stabilizer additive by passing a steady stream of air through the copper electrolyte (ASM Handbook, Vol. 5: Surface Engineering, pp. 311-312 and C. F. Coombs, Jr., "Printed Circuits Handbook", 5th Ed. 2001, Chapter 28.5, pages 28.7 to 28.10).

The first conductive layer (10) generally has a thickness in the range of 0.01 to 1.5 μm, more preferably from 0.05 to 0.8 μm and most preferably from 0.1 to 0.6 μm.

The first conductive layer (10) can be thinner in case of the method according to the present invention in order to provide an electrically conductive surface for electroplating because a sufficiently electrically conductive first conductive layer (10) can be achieved on the smooth front side (1a) surface area of the build-up layer (1) at a lower thickness compared to a roughened dielectric surface in case of SAP methods. A further reason why the first conductive layer (10) can be thinner compared to standard SAP methods is because no first conductive layer (10) needs to be simultaneously plated into the at least one opening (4). The advantage of a front side (1a) surface area of the build-up layer (1) which is not subjected to a roughening process prior to deposition of the first conductive layer (10) are a) a reduced risk of damaging the copper layer (8) when removing those portions of the first conductive layer (10) which are not covered by said copper layer (8) in step (ix) and b) a reduced risk that portions of the first conductive layer (10) to be etched away remain on the front side (1a) surface area of the build-up layer (1) and can cause circuit shorts. Suitable etchants preferably attack the first conductive layer (10) instead of the electroplated copper layer (8) due to different microstructures (e.g. grain size) of copper deposited by electroless plating and electroplating. But in case of a roughened front side (1a) surface area of the build-up layer (1), harsher etching conditions must be applied and, hence, an etch attack of the electroplated copper layer (8) can not be avoided in this case. Hence, the desired shape of copper features such as tracks can be achieved with the method according to the present invention. Furthermore, unwanted residues of the first conductive layer (10) between individual features of the copper layer (8) which can be a source of circuit shorts are less likely.

Next, at least one opening (4) is formed for example by laser drilling through the first conductive layer (10), the adhesion promoting layer (9) and the build-up layer (1) down to the at least one copper area (2) which serves as the metallic bottom of the at least one opening (4). The at least one opening (4) is for example a blind micro via. Formation of the at least one opening (4) is shown in FIG. 2c.

Next, the side walls and the copper area (2) of the at least one opening (4) are subjected to a cleaning process in order to remove smear and other residues derived from the formation of the at least one opening (4). The cleaning process may be a desmear process. This is possible, because the first conductive layer (10) attached to the front side (1a) of the build-up layer (1) protects the smooth surface of said front side (1a) during desmearing the dielectric side walls of the at least one opening (4).

The side walls and the copper area (2) of the at least one opening (4) are preferably cleaned by either a wet chemical desmear method or a plasma desmear method (FIG. 2d). Such methods are known in the art (e.g.: C. F. Coombs, Jr., "Printed Circuits Handbook", 5$^{th}$ Ed. 2001, Chapter 28.4, pages 28.5 to 28.7).

A wet chemical desmear method comprises the steps of a) swelling the surfaces of the dielectric side walls of the at least one opening (4), etching the surfaces of the dielectric side walls of the at least one opening (4) with a permanganate solution and c) removing $MnO_2$ from the dielectric side walls of the at least one opening (4) by reducing. Thereby, smear and other residues from the formation of the at least one opening (4) in step (iii) are also removed from the surface of the copper area (2) in the at least one opening (4).

Plasma desmear is a dry chemical method in which the dielectric substrate surface is exposed for example to oxygen and/or fluorocarbon gases such as $CF_4$.

After cleaning the side walls and the copper area (2) of the at least one opening (4), a second conductive layer (11) formed by one member of the group consisting of electrically conductive polymers, colloidal noble metal particles, electrically conductive carbon particles and copper deposited by electroless plating is deposited at least onto the cleaned side walls (5b) of the at least one opening (4).

In case an electrically conductive polymer is applied as the second conductive layer (11), said electrically conductive polymer is only deposited onto the cleaned side walls (5b) of the at least one opening (4). This is shown in FIG. 2e.

Preferably, the second conductive layer (11) comprises an electrically conductive polymer selected form the group consisting of polythiophene, polypyrrol, polyaniline, derivatives and mixtures thereof.

The most preferred electrically conductive polymer is selected from polythiophene, derivatives thereof and mixtures thereof.

The second conductive layer (11) comprising polythiophene, a derivative thereof and a mixture thereof can be formed in a process comprising, in this order, the steps of
a) bringing the cleaned side walls (5b) of the at least one opening (4) into contact with a solution of a water-soluble polymer,
b) treating the cleaned side walls (5b) of the at least one opening (4) with a permanganate solution and
c) treating the cleaned side walls (5b) of the at least one opening (4) with an acidic aqueous solution or an acidic microemulsion of aqueous base containing at least one thiophene compound and at least one sulfonic acid.

Such a process results in the selective formation of a conductive organic polymer on the cleaned side walls (5b) of the at least one opening (4) only. No electrically conductive polymer is formed on the first conductive layer (10) and the copper area (2) which is exposed after formation of the at least one opening (4).

The water-soluble polymer used in step a) is selected from the group consisting of polyvinyl amine, polyethylene imine, polyvinyl imidazole, alkylamine ethylene oxide copolymers, polyethylene glycol, polypropylene glycol, copolymers of ethylene glycol and polypropylene glycol, polyvinyl alcohol, polyacrylates, polyacrylamide, polyvinylpyrrolidone and mixtures thereof. The concentration of the water-soluble polymer ranges from 20 mg/l to 10 g/l.

The solution of a water-soluble polymer may further contain a water-soluble organic solvent selected from the group consisting of ethanol, propanol, ethylene glycol, diethyleneglycol, glycerine, dioxin, butyrolactone, N-methyl pyrrolidone, dimethyl formamide, dimethylacetamide, half ethers and half esters of ethylene glycol. The water-soluble organic solvent may be utilized either in pure form or diluted with water. The concentration of the water-soluble organic solvent ranges from 10 ml/l to 200 ml/l. The solution of a water-soluble polymer is held at a temperature in the range of 25° C. to 85° C. and the substrate is immersed in this solution for 15 s to 15 min during step a).

Next, the such treated side walls (5b) of the at least one opening (4) are contacted with a permanganate solution in step b). The source of permanganate ions can be any water-soluble permanganate compound. Preferably the source of permanganate ions is selected from sodium permanganate and potassium permanganate. The concentration of permanganate ions ranges from 0.1 mol/l to 1.5 mol/l. The permanganate solution can be either acidic or alkaline. Preferably, the permanganate solution has a pH value in the range of 2.5 to 7. By means of step b) a layer of $MnO_2$ is formed on the cleaned side walls (5b) of the at least one opening (4).

The cleaned side walls (5b) of the at least one opening (4) is then contacted in step c) with a solution comprising a thiophene compound and a sulfonic acid.

The thiophene compound is preferably selected from 3-heterosubstituted thiophenes and 3,4-heterosubstituted thiophenes. Most preferably, the thiophene compound is selected from the group consisting of 3,4-ethylene dioxythiophene, 3-methoxy thiophene, 3-methyl-4-methoxy thiophene and derivatives thereof.

The concentration of the thiophene compound ranges from 0.001 mol/l to 1 mol/l, more preferably from 0.005 mol/l to 0.05 mol/l.

The sulfonic acid is selected from the group comprising methane sulfonic acid, ethane sulfonic acid, methane disulfonic acid, ethane disulfonic acid, naphthalene-1-5-disulfonic acid, dodecylbenzenesulfonic acid, polystyrenesulfonic acid and mixtures thereof. The concentration of the sulfonic acid is set by adjusting the desired pH value of the solution utilized in step c). Preferably the pH value of said solution is set in the range of 0 to 3, more preferably in the range of 1.5 to 2.1.

When contacting the cleaned side walls (5b) of the at least one opening (4) with said acidic aqueous solution or an acidic microemulsion of aqueous base containing at least one thiophene compound and at least one sulfonic acid in step c) the thiophene compound polymerizes when in contact with $MnO_2$ deposited in step b). The second conductive layer (11) is then formed by polythiophene and derivatives thereof obtained by the thiophene compounds in the presence of $MnO_2$.

Such a process only leads to the formation of a conductive organic polymer on those parts of the substrate surface which consist of the dielectric substrate material, i.e. the cleaned side walls (5b) of the at least one opening (4). The surface of the first conductive layer (10) is free of said conductive organic polymer serving as the second conductive layer (11).

Processes involving the use of electrically conductive carbon particles like graphite can also be applied (Printed Circuits Handbook, $5^{th}$ Ed. 2001, Ed.: C. F. Coombs, Jr., pp. 30.4 to 30.6). The substrate surface is first conditioned and then coated with electrically conductive carbon particles. Next, the carbon coating is dried and the portions of carbon particles deposited onto the first conductive layer (10) are removed. Such a carbon coating serves as a second conductive layer (11) and is suitable as a surface for electroplating of copper.

In another embodiment of the present invention the second conductive layer (11) is formed by a colloidal noble metal (Printed Circuits Handbook, $5^{th}$ Ed. 2001, Ed.: C. F. Coombs, Jr., pp. 30.2 to 30.4). The conductivity of colloidal palladium particles can be increased by e.g. providing sulfide "bridges" between individual colloidal palladium particles adsorbed to the substrate surface. The conductivity of the adsorbed colloidal palladium particles is then high enough to serve as a second conductive layer (11) for successive electroplating of copper.

In still another embodiment of the present invention, the second conductive layer (11) is formed by electroless plating of copper. The copper layer is deposited onto the first conductive layer (10), the cleaned side walls (5b) and the copper area (2) of the at least one opening (4). Preferably, the first conductive layer (10) is removed prior to electroless deposition of copper as the second conductive layer (11). Accordingly, the second conductive layer (11) is deposited onto the front side (1a) surface area of the build-up layer (1), the cleaned side walls (5b) and the copper area (2) of the at least one opening (4) in this embodiment. Preferably in this case, the first conductive layer (10) is removed between step (iv) and step (v).

A layer of a resist material is then deposited onto the first conductive layer (1) and patterned to form the patterned resist layer (7). This is shown in FIG. 2f. The patterned resist layer (7) is a negative image of the circuitry pattern deposited in the next step by electroplating of copper.

The photolithographic process sequence for imaging (patterning) basically involves applying a light-sensitive polymeric material (resist material) onto the first conductive layer (10), exposing this photoresist to light with the desired pattern, and developing the exposed pattern. Both liquid and dry film resist materials can be used to form the patterned resist layer (7). Preferably, a dry film resist material is used to form the patterned resist layer (8).

Suitable resist materials, methods for their deposition on a substrate surface and pattern formation are well known in the art (C. F. Coombs, Jr., "Printed Circuits Handbook", $5^{th}$ Ed. 2001, Chapter 26, pages 26.1 to 26.30).

Next, the surface of the substrate is rinsed and is then suited for formation of copper deposits (8) by electroplating of copper. The electroplated substrate is shown in FIG. 2g.

Electroplating solutions for copper deposition suitable to be used in step (viii) are known in the art. Preferably, acidic copper plating baths comprising copper ions, an acid, organic additives and chloride ions are used. Such copper plating bath compositions are disclosed for example in C. F. Coombs, Jr., "Printed Circuits Handbook", $5^{th}$ Ed. 2001, Chapter 29.4, pages 29.4 to 29.15.

Next, the patterned resist layer (7) is removed by methods known in the art. The patterned resist layer (7) can either be stripped, dissolved, ablated or removed by another method. Stripping and dissolution are wet chemical methods whereas ablation utilises e.g., a laser beam to evaporate the patterned resist layer (7). This is shown in FIG. 2h. Suitable wet chemical methods for removing the patterned resist layer (7) are for example described in C. F. Coombs, Jr., "Printed Circuits Handbook", $5^{th}$ Ed. 2001, Chapter 26.6.6, page 26.27 and Chapter 33.3.2, page 33.5.

The complete removal of the patterned resist layer (7) can be for example accomplished in 1 Molar or greater solutions of sodium or potassium hydroxide at elevated temperatures, often with an anti-tarnishing additive to limit oxidation of the copper. Additionally, the patterned resist layer (7) can be removed by one or more of the following: halogenated hydrocarbons, such as methylene chloride, amines and their derivatives, such as dimethylsulfoxide, dimethylformamide, N-methyl-2-pyrrolidinone, glycol ethers, such as ethylene glycol monomethyl ether, ethanol, ketones, such as methylethyl ketone and acetone and materials, such as isopropyl alcohol, sulfuric acid, ammonium persulfate and mixtures of caustic and phenol derivatives, as well as various other materials.

The kind of solution and the parameters such as contacting time with the solution and temperature of the solution may need to be adjusted to the type of resist material used for the patterned resist layer (7). The adjustment is a common procedure for those skilled in the art.

A particularly suitable method for removing the patterned resist layer (7) is disclosed in EP 1 904 898 B1 which comprises the following steps:

a) treating the substrate with an aqueous solution containing a base and
b) thereafter further treating the substrate with a solution containing a base and at least one stripping enhancer selected from the group consisting of hexyleneglycol, ethylene glycol monoethyl ether, ethyleneglycol monobutyl ether, ethylene glycol monoisopropyl ether, propylene glycol monomethyl ether, propylene glycol monoethyl ether, propylene glycol monobutyl ether, diethylene glycol monomethyl ether, diethylene glycol monoethyl ether, diethylene glycol monopropyl ether, diethylene glycol monobutyl ether, dipropylene glycol monomethyl ether, dipropylene glycol monoethyl ether, dipropylene glycol monopropyl ether, dipropylene glycol monobutyl ether, triethylene glycol monomethyl ether, triethylene glycol monoethyl ether, triethylene glycol monopropyl ether, triethylene glycol monobutyl ether, tripropylene glycol monomethyl ether, tripropylene glycol monoethyl ether, tripropylene glycol monopropyl ether, tripropylene glycol monobutyl ether, ethylene glycol monoisopropyl ether and propylene glycol monomethyl ether acetate.

Those portions of the first conductive layer (10) which were covered by the patterned resist layer (7) and, hence, which are not covered by the electroplated copper deposit (8), are removed in step (ix). This is shown in FIG. 2i. Those portions can for example be removed by differential etching which is an established process (C. F. Coombs, Jr., "Printed Circuits Handbook", 5$^{th}$ Ed. 2001, Chapter 33.4, page 33.6 to 33.18). Suitable etching solutions and etching conditions are chosen in routing experiments. Preferred etching compositions are selected from sulphuric acid-peroxide etchants and etchants comprising one or more of ferric chloride and ferric sulfate.

The advantages of a method according to the present invention in respect to SAP methods known in the art are manifold:

Application of an adhesion promoter (9) onto the front side (1a) surface area of the build-up layer (1) allows to avoid roughening of said front side (1a) surface area by; for example a desmear method in order to provide a sufficient adhesion to the first conductive layer (10). The impact of a smooth front side (1a) surface area of the build-up layer (1) is as follows:

Manufacture of a fine line circuitry having a line width and inter line spacing of 10 μm or less on the front side (1a) surface area of the build-up layer (1) is feasible as compared to prior art methods applying a roughening of said front side (1a) surface area.

The thickness of the first conductive layer (10) can be reduced in comparison to a roughened front side (1a) surface area of the build-up layer (1) which allows laser drilling of at least one opening (4) after formation of the first conductive layer (10).

Furthermore, differential etching of a first conductive layer (10) which is deposited onto a smooth front side (1a) surface area of the build-up layer (1) is less difficult. This reduces the risk of short circuits due to remaining portions of the first conductive layer (10) after etching and furthermore leads to a reduced attack of the copper layer (8) during said etching step (ix). Hence, the shape of electroplated copper features obtained by the method according to the present invention is improved.

The invention claimed is:
1. A method for manufacture of fine line circuitry comprising, in the following order, the steps of
(i) providing a dielectric build-up layer having a front side surface area and a back side surface area and wherein at least a portion of the back side surface area comprises at least one copper area and wherein a dielectric layer is attached to said back side surface area and wherein an adhesion promoting layer consisting of organosilane compounds is attached to the front side surface area of the build-up layer, wherein the adhesion promoting layer is formed by
(a) treating said front side surface area with a solution comprising at least one organosilane compound to form the adhesion promoting layer consisting of the organosilane compounds, and
(b) treating said adhesion promoting layer consisting of the organosilane compounds with a solution comprising an oxidizing agent,
(ii) depositing a first conductive layer onto the adhesion promoting layer,
(iii) forming at least one opening which extends through the first conductive layer, the adhesion promoting layer and the build-up layer to the at least one copper area,
(iv) cleaning the dielectric side walls and the copper area of the at least one opening to obtain cleaned side walls and a cleaned copper area,
(v) forming a second conductive layer only on the cleaned side walls wherein the second conductive layer is selected from the group consisting of electrically conductive polymers, colloidal particles comprising a noble metal, and electrically conductive carbon particles,
(vi) applying a resist layer onto the first conductive layer; and patterning said resist layer,
(vii) depositing a copper layer by electroplating into the at least one opening of the patterned resist layer,
(viii) removing the patterned resist layer and
(ix) removing those portions of the first conductive layer which are not covered by the electroplated copper layer.

2. The method for manufacture of fine line circuitry according to claim 1 wherein the at least one organosilane compound is represented by the formula $$A_{(4-x)}SiB_x$$

wherein
each A is a hydrolyzable group,
x is 1 to 3, and
each B is independently selected from the group consisting of $C_1$-$C_{20}$ alkyl, aryl, amino aryl and a functional group represented by the formula $$C_nH_{2n}X,$$

wherein
n is from 0 to 15, and
X is selected from the group consisting of amino, amido, hydroxy, alkoxy, halo, mercapto, carboxy, carboxy ester, carboxamide, thiocarboxamide, acyl, vinyl, allyl, styryl, epoxy, epoxycyclohexyl, glycidoxy, isocyanato, thiocyanato, thioisocyanato, ureido, thioureido, guanidino, thioglycidoxy, acryloxy, methacryloxy groups, carboxy ester, and $Si(OR)_3$, and wherein R is a $C_1$-$C_5$ alkyl group.

3. The method for manufacture of fine line circuitry according to claim 2 wherein the hydrolyzable group A is selected from the group consisting of —OH, —OR$^2$ and wherein R$^2$ is selected from the group consisting of $C_1$-$C_5$ alkyl and —OCOR$^3$ and wherein R$^3$ is H or a $C_1$-$C_5$ alkyl group.

4. The method for manufacture of fine line circuitry according to claim 1 wherein the oxidizing agent is an alkaline aqueous solution of permanganate ions.

5. The method for manufacture of fine line circuitry according to claim 1 wherein the first conductive layer comprises copper deposited by electroless plating.

6. The method for manufacture of fine line circuitry according to claim 1 wherein the at least one opening is formed by laser drilling.

7. The method for manufacture of fine line circuitry according to claim 1 wherein the dielectric side walls and the copper area of the at least one opening are cleaned by a desmear method.

8. The method for manufacture of fine line circuitry according to claim 1 wherein the second conductive layer comprises an electrically conductive polymer which is selected from the group consisting of polythiophene, polypyrrole, polyaniline, derivatives and mixtures thereof.

9. The method for manufacture of fine line circuitry according to claim 1 wherein the second conductive layer in step (v) is formed by
(v) a) bringing the cleaned side walls of the at least one opening into contact with a solution of a water-soluble polymer,
(v) b) treating the cleaned side walls of the at least one opening with a permanganate solution and
(v) c) treating the cleaned side walls of the at least one opening with an acidic aqueous solution or an acidic microemulsion of aqueous base containing at least one thiophene compound and at least one sulfonic acid.

10. The method for manufacture of fine line circuitry according to claim 9 wherein the water-soluble polymer is selected from the group consisting of polyvinyl amine, polyethylene imine, polyvinyl imidazole, alkylamine ethylene oxide copolymers, polyethylene glycol, polypropylene glycol, copolymers of ethylene glycol and polypropylene glycol, polyvinyl alcohol, polyacrylates, polyacrylamide, polyvinylpyrrolidone and mixtures thereof.

11. The method for manufacture of fine line circuitry according to claim 9 wherein the at least one thiophene compound is selected from the group consisting of 3-heterosubstituted thiophenes and 3,4-heterosubstituted thiophenes.

12. The method for manufacture of fine line circuitry according to claim 10 wherein the at least one thiophene compound is selected from the group consisting of 3-heterosubstituted thiophenes and 3,4-heterosubstituted thiophenes.

13. The method for manufacture of fine line circuitry according to claim 9 wherein the at least one sulfonic acid is selected from the group comprising methane sulfonic acid, ethane sulfonic acid, methane disulfonic acid, ethane dilsulfonic acid, naphthalene-1-5-disulfonic acid, dodecylbenzenesulfonic acid, polystyrenesulfonic acid and mixtures thereof.

14. The method for manufacture of fine line circuitry according to claim 10 wherein the at least one sulfonic acid is selected from the group comprising methane sulfonic acid, ethane sulfonic acid, methane disulfonic acid, ethane dilsulfonic acid, naphthalene-1-5-disulfonic acid, dodecylbenzenesulfonic acid, polystyrenesulfonic acid and mixtures thereof.

15. The method for manufacture of fine line circuitry according to claim 11 wherein the at least one sulfonic acid is selected from the group comprising methane sulfonic acid, ethane sulfonic acid, methane disulfonic acid, ethane dilsulfonic acid, naphthalene-1-5-disulfonic acid, dodecylbenzenesulfonic acid, polystyrenesulfonic acid and mixtures thereof.

16. The method for manufacture of fine line circuitry according claim 9 wherein the pH value of the solution comprising at least one thiophene compound and at least on sulfonic acid ranges from 0 to 3.

17. The method for manufacture of fine line circuitry according claim 10 wherein the pH value of the solution comprising at least one thiophene compound and at least on sulfonic acid ranges from 0 to 3.

18. The method for manufacture of fine line circuitry according claim 11 wherein the pH value of the solution comprising at least one thiophene compound and at least on sulfonic acid ranges from 0 to 3.

19. The method for manufacture of fine line circuitry according claim 12 wherein the pH value of the solution comprising at least one thiophene compound and at least on sulfonic acid ranges from 0 to 3.

20. The method for manufacture of fine line circuitry according claim 13 wherein the pH value of the solution comprising at least one thiophene compound and at least on sulfonic acid ranges from 0 to 3.

* * * * *